(12) United States Patent
Tu et al.

(10) Patent No.: US 9,190,398 B2
(45) Date of Patent: Nov. 17, 2015

(54) METHOD FOR PACKAGING AN OPTICAL MODULE

(71) Applicant: LINGSEN PRECISION INDUSTRIES, LTD., Taichung (TW)

(72) Inventors: Ming-Te Tu, Taichung (TW); Yao-Ting Yeh, Taichung (TW)

(73) Assignee: LINGSEN PRECISION INDUSTRIES, LTD., Taichung (TW)

( * ) Notice: Subject to any disclaimer, the term of this patent is extended or adjusted under 35 U.S.C. 154(b) by 0 days.

(21) Appl. No.: 14/073,567

(22) Filed: Nov. 6, 2013

(65) Prior Publication Data

US 2015/0028360 A1    Jan. 29, 2015

(30) Foreign Application Priority Data

Jul. 25, 2013    (TW) .............................. 102126688 A

(51) Int. Cl.
*H01L 21/00* (2006.01)
*H01L 25/16* (2006.01)
*H01L 31/16* (2006.01)
*H01L 31/167* (2006.01)

(52) U.S. Cl.
CPC ............ *H01L 25/167* (2013.01); *H01L 25/165* (2013.01); *H01L 31/16* (2013.01); *H01L 31/167* (2013.01); *H01L 2224/32225* (2013.01); *H01L 2224/48227* (2013.01); *H01L 2224/73265* (2013.01); *H01L 2924/1815* (2013.01)

(58) Field of Classification Search
CPC ................ H01L 25/165; H01L 25/167; H01L 17/14618; G01D 5/26
USPC ................ 438/25; 257/82, E33.072; 720/150
See application file for complete search history.

(56) References Cited

U.S. PATENT DOCUMENTS

| | | | |
|---|---|---|---|
| 6,169,295 B1 * | 1/2001 | Koo | 257/81 |
| 6,674,159 B1 * | 1/2004 | Peterson et al. | 257/680 |
| 6,777,263 B1 * | 8/2004 | Gan et al. | 438/106 |
| 6,800,508 B2 * | 10/2004 | Kimura | 438/123 |
| 6,955,934 B2 * | 10/2005 | Gallup et al. | 438/27 |
| 7,576,426 B2 * | 8/2009 | Gan et al. | 257/710 |
| 7,635,606 B2 * | 12/2009 | Warren et al. | 438/64 |
| 7,671,373 B2 * | 3/2010 | Wang et al. | 257/81 |
| 7,763,896 B2 * | 7/2010 | Wang et al. | 257/82 |
| 8,265,432 B2 * | 9/2012 | Doany et al. | 385/14 |
| 8,779,361 B2 * | 7/2014 | Costello et al. | 250/338.1 |
| 8,809,116 B2 * | 8/2014 | Tabrizi | 438/108 |
| 8,822,245 B2 * | 9/2014 | Medendorp, Jr. | 438/29 |

(Continued)

FOREIGN PATENT DOCUMENTS

TW           M399313 U        3/2011

*Primary Examiner* — Caleb Henry

(74) *Attorney, Agent, or Firm* — Muncy, Geissler, Olds & Lowe, P.C.

(57) ABSTRACT

A package structure of an optical module includes: a substrate defined with a light-emitting region and a light-admitting region; a light-emitting chip disposed at the light-emitting region of the substrate; a light-admitting chip disposed at the light-admitting region of the substrate; two encapsulants for enclosing the light-emitting chip and the light-admitting chip, respectively; and a shielding layer formed on the substrate and the encapsulants and having a light-emitting hole and a light-admitting hole, wherein the light-emitting hole and the light-admitting hole are positioned above the light-emitting chip and the light-admitting chip, respectively. Accordingly, the optical module package structure simplifies a packaging process and cuts manufacturing costs.

5 Claims, 2 Drawing Sheets

(56) References Cited

U.S. PATENT DOCUMENTS

| | | | |
|---|---|---|---|
| 8,897,028 B2* | 11/2014 | Takemura | 361/777 |
| 2003/0174383 A1* | 9/2003 | Bolle et al. | 359/295 |
| 2003/0189213 A1* | 10/2003 | Igaki et al. | 257/81 |
| 2004/0259325 A1* | 12/2004 | Gan | 438/456 |
| 2007/0284589 A1* | 12/2007 | Ng et al. | 257/79 |
| 2008/0284311 A1* | 11/2008 | Schug | 313/498 |
| 2009/0057687 A1* | 3/2009 | Wang et al. | 257/82 |
| 2010/0065859 A1* | 3/2010 | Suzuki et al. | 257/82 |
| 2010/0181578 A1* | 7/2010 | Li et al. | 257/82 |
| 2010/0219422 A1* | 9/2010 | Su et al. | 257/82 |
| 2011/0272566 A1* | 11/2011 | Lippuner | 250/231.13 |
| 2012/0025211 A1* | 2/2012 | Yeh et al. | 257/82 |
| 2012/0032208 A1* | 2/2012 | Brandes | 257/89 |
| 2012/0242933 A1* | 9/2012 | Takase | 349/62 |
| 2012/0286297 A1* | 11/2012 | Wang | 257/88 |
| 2012/0315713 A1* | 12/2012 | Chen | 438/27 |
| 2012/0326170 A1* | 12/2012 | Liu et al. | 257/82 |
| 2013/0015478 A1* | 1/2013 | Oh et al. | 257/98 |
| 2013/0032842 A1* | 2/2013 | Park et al. | 257/98 |
| 2013/0292706 A1* | 11/2013 | Costello et al. | 257/82 |
| 2013/0334544 A1* | 12/2013 | Luruthudass et al. | 257/82 |
| 2013/0341650 A1* | 12/2013 | Peng | 257/82 |
| 2014/0097451 A1* | 4/2014 | Lin | 257/82 |
| 2014/0175462 A1* | 6/2014 | Lermer et al. | 257/82 |
| 2014/0264410 A1* | 9/2014 | Lin et al. | 257/98 |
| 2014/0361200 A1* | 12/2014 | Rudmann et al. | 250/578.1 |
| 2014/0374777 A1* | 12/2014 | Tanuma | 257/82 |

* cited by examiner

METHOD FOR PACKAGING AN OPTICAL MODULE

BACKGROUND OF THE INVENTION

1. Technical Field

The present invention relates to package structures, and more particularly, to a package structure of an optical module.

2. Description of Related Art

At present, an optical proximity sensing module is regarded as a mainstream technology choice for use with the new-generation smart electronic devices (such as smartphones). If the electronic device is brought close to the human ear (for face recognition) or put in a pocket, the optical proximity sensing module will turn off the screen display of the electronic device right away to save power and prevent an inadvertent touch on the screen display, thereby enhancing ease of use. The optical proximity sensing module comprises a light-emitting chip (such as a light-emitting diode, LED) for emitting a light beam. The light beam reflects off an object surface to fall on a light-admitting chip and convert into an electronic signal for subsequent processing. For instance, Taiwan patent M399313 discloses a proximity sensing package structure which comprises a base, a dam extending vertically and enclosing the base, and a lid disposed on the dam, so as to form a receiving space, wherein the receiving space has therein a partition board for dividing the receiving space, such that a light-emitting chip and a light-admitting chip can be separately disposed on a substrate to shun mutual light beam-related interference which might otherwise result in deterioration of product performance.

However, due to technological development, portable devices (such as smartphones, digital cameras, and other electronic products) are in increasingly wide use and have a trend toward reduction of weight and thickness, low costs, and high yield. However, the aforesaid patent is becoming less effective in coping with the aforesaid trend.

SUMMARY OF THE INVENTION

It is an objective of the present invention to provide a package structure of an optical module to simplify the packaging process and cut the manufacturing costs.

In order to achieve the above and other objectives, the present invention provides a method for packaging an optical module, the method comprising the steps of:

(a) defining a light-emitting region and a light-admitting region on a substrate;

(b) connecting electrically the light-emitting chip and light-admitting chip to the light-emitting region and the light-admitting region of the substrate, respectively;

(c) forming a transparent encapsulant on the light-emitting chip and the light-admitting chip;

(d) forming an opaque shielding layer on the encapsulants and the substrate; and (e) removing the shielding layer above the light-emitting chip and the light-admitting chip.

The encapsulants and the shielding layer are formed by molding.

The encapsulants are substantially inverted T-shaped.

The removal of the shielding layer is achieved by polishing, wherein the shielding layer is polished until the protruding top ends of the encapsulants are exposed, respectively.

The electrical connection step is achieved by a wire bonding process and a die attaching process.

The method further comprises step (e) in which the optical module packaged by the step (a) through step (d) is cut or punched.

The present invention further provides a package structure of an optical module, comprising a substrate, a light-emitting chip, a light-admitting chip, two encapsulants, and a shielding layer.

The substrate is defined with a light-emitting region and a light-admitting region.

The light-emitting chip is disposed at the light-emitting region of the substrate.

The light-admitting chip is disposed at the light-admitting region of the substrate.

The two encapsulants enclose the light-emitting chip and the light-admitting chip, respectively.

The shielding layer is formed on the substrate and the encapsulants and has a light-emitting hole and a light-admitting hole. The light-emitting hole and the light-admitting hole are positioned above the light-emitting chip and the light-admitting chip, respectively.

The encapsulants and the shielding layer are made of a transparent opaque resin.

The substrate is a non-ceramic substrate made of an organic material, such as Bismaleimide Triazine.

Accordingly, an optical module package structure of the present invention is manufactured by removing a shielding layer above a light-emitting chip and a light-admitting chip and exposing top ends of encapsulants only, thereby simplifying the packaging process and cutting the manufacturing costs.

To enable persons skilled in the art to gain insight into the framework, features, and objectives of the present invention and implement the present invention accordingly, the present invention is hereunder illustrated with a preferred embodiment and the accompanying drawings and described in detail. However, the description below is merely intended to illustrate the technical solution and features of the present invention and the embodiment thereof. All simple modifications, replacements, or constituent component sparing made, without going against the spirit of the present invention, by persons skilled in the art after understanding the technical solution and features of the present invention should fall within the claims of the present invention.

BRIEF DESCRIPTION OF THE SEVERAL VIEWS OF THE DRAWINGS

The technical contents and features of the present invention are hereunder illustrated with a preferred embodiment in conjunction with the accompanying drawings, in which.

DETAILED DESCRIPTION OF THE EMBODIMENT OF THE INVENTION

Figure 1:
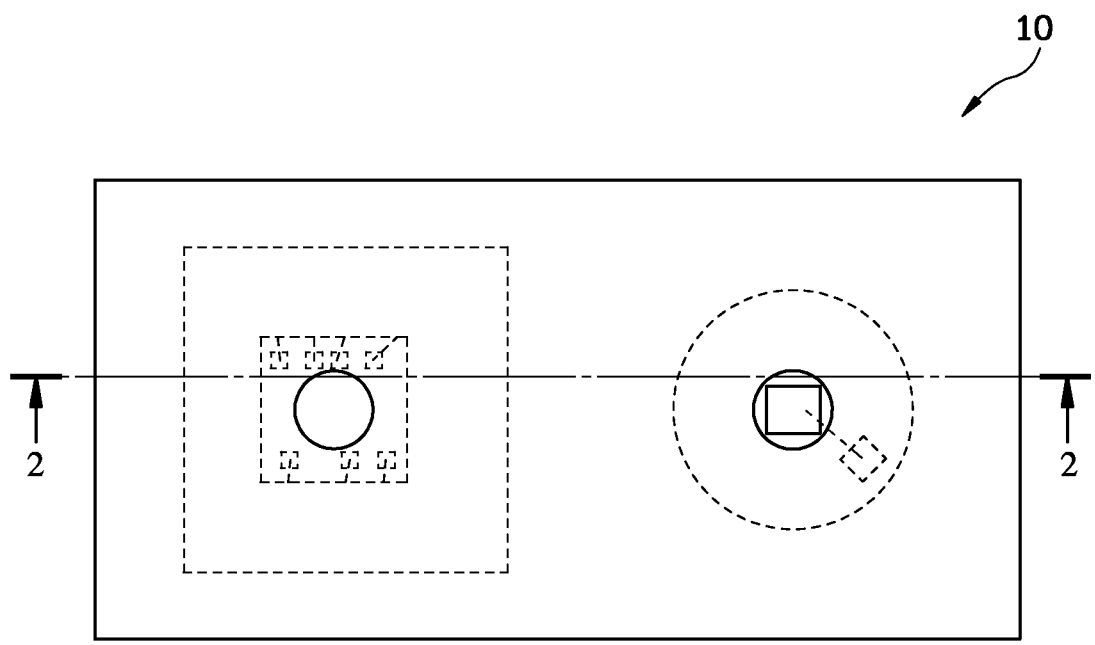
FIG. 1 is a top view of an optical module package structure according to a preferred embodiment of the present invention.
Figure 2:
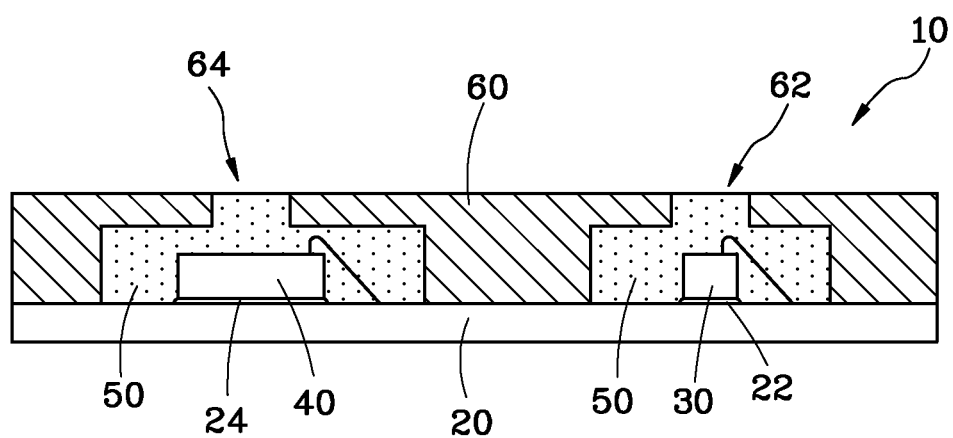
FIG. 2 is a cross-sectional view of the optical module package structure taken along line 2-2 of FIG. 1 according to the preferred embodiment of the present invention.

Referring to FIG. 1 through FIG. 2, an optical module package structure 10 provided according to a preferred embodiment of the present invention results from cutting a module from a typical package array and comprises a substrate 20, a light-emitting chip 30, a light-admitting chip 40, two encapsulants 50, and a shielding layer 60.

The substrate 20 is a non-ceramic substrate made of an organic material, such as Bismaleimide Triazine, and thus the substrate 20 incurs a low material cost. The substrate 20 is defined with a light-emitting region 22 and a light-admitting region 24.

The light-emitting chip 30 and the light-admitting chip 40 undergo a die attaching process and a wire bonding process so as to be disposed at the light-emitting region 22 and the light-admitting region 24 of the substrate 20, respectively. The light-emitting chip 30 emits the light beam. The light-admitting chip 40 receives the light beam emitted from the light-emitting chip 30.

The encapsulants 50 are made of a transparent resin, such as a transparent epoxy resin. The encapsulants 50 enclose the light-emitting chip 30 and the light-admitting chip 40, respectively, by molding.

The shielding layer 60 is made of an opaque resin, such as an opaque epoxy resin. The shielding layer 60 is formed on the substrate 20 and the encapsulants 50 and has a light-emitting hole 62 and a light-admitting hole 64. The light-emitting hole 62 and the light-admitting hole 64 are positioned above the light-emitting chip 30 and the light-admitting chip 40, respectively.

Figure 3:
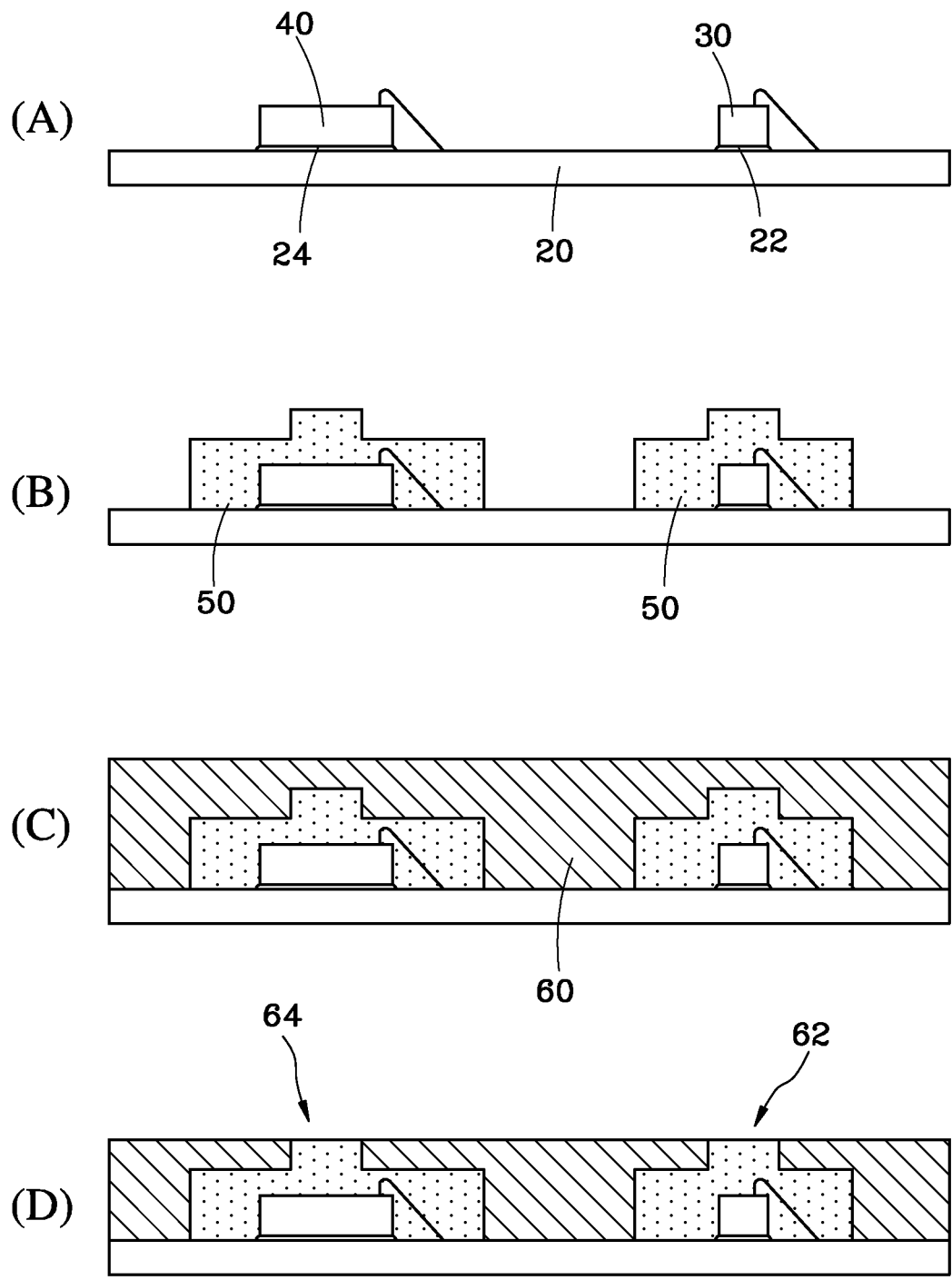
FIG. 3 is a schematic view of the process flow of a packaging method according to the preferred embodiment of the present invention.

Referring to FIG. 3, A through D, there is shown a schematic view of the process flow of a method for packaging an optical module according to the present invention. The first step A involves defining the light-emitting region 22 and the light-admitting region 24 on the single substrate 20 of each substrate array and electrically connecting the light-emitting chip 30 and the light-admitting chip 40 to the light-emitting region 22 and the light-admitting region 24 of the substrate 20 by a die attaching process and a wire bonding process, respectively. The second step B involves forming a transparent encapsulant 50 on the light-emitting chip 30 and the light-admitting chip 40 by molding, so as to form a protective layer. The third step C involves forming an opaque shielding layer 60 on the encapsulants 50 and the substrate 20 by molding. The fourth step D involves removing the shielding layer 60 above the light-emitting chip 30 and the light-admitting chip 40. Finally, the structure fabricated by the aforesaid steps undergoes a cutting process or a punching process to form a single module.

In the preferred embodiment of the present invention, the second step B through the fourth step D comprise: aligning an inverted T-shaped die with the light-emitting chip 30 and the light-admitting chip 40 and positioning the inverted T-shaped die on the surface of the substrate 20; filling the inverted T-shaped die with a transparent resin such that the transparent resin covers the chips 30, 40; removing the inverted T-shaped die as soon as the transparent resin sets so as to form the substantially inverted T-shaped encapsulants 50; positioning a hollow-cored die on the substrate 20; filling the die with an opaque resin to thereby cover the encapsulants 50 completely with the opaque resin such that the shielding layer 60 is formed as soon as the opaque resin sets; and polishing the shielding layer 60 from the top and horizontally to thin the shielding layer 60 gradually until the protruding top ends of the encapsulants 50 are exposed, respectively, so as to form the light-emitting hole 62 and the light-admitting hole 64 in the shielding layer 60.

In conclusion, the optical module package structure 10 of the present invention is characterized by forming the shielding layer 60 above the light-emitting chip 30 and the light-admitting chip 40 by the first and second molding processes and then polishing the shielding layer 60 by a polishing process until the top ends of the encapsulants 50 are exposed, respectively, to form the light-emitting hole 62 and the light-admitting hole 64 in the shielding layer 60, thereby simplifying the packaging process and cutting the manufacturing costs.

Constituent elements disclosed in the aforesaid embodiment of the present invention are illustrative rather than restrictive of the present invention. The replacements or changes of other equivalent elements should still fall within the appended claims of the present invention.

What is claimed is:

1. A method for packaging an optical module, the method comprising the steps of:
    (a) defining a light-emitting region and a light-admitting region on a substrate;
    (b) connecting electrically a light-emitting chip and a light-admitting chip to the light-emitting region and the light-admitting region of the substrate, respectively;
    (c) forming a transparent encapsulant on the light-emitting chip and the light-admitting chip;
    (d) forming a shielding layer on the encapsulants and the substrate; and
    (e) removing the shielding layer above the light-emitting chip and the light-admitting chip,
    wherein the removal of the shielding layer is achieved by polishing the shielding layer until protruding top ends of the encapsulants are exposed, respectively.

2. The method of claim 1, wherein the encapsulant and the shielding layer are formed by molding.

3. The method of claim 1, wherein the encapsulants are substantially inverted T-shaped.

4. The method of claim 1, wherein the electrical connection step is achieved by a wire bonding process and a die attaching process.

5. The method of claim 1, further comprising step (e) of cutting or punching the optical module packaged by step (a) through step (d).

* * * * *